(12) United States Patent
Kim

(10) Patent No.: US 8,618,615 B2
(45) Date of Patent: Dec. 31, 2013

(54) SEMICONDUCTOR DEVICE AND FABRICATION METHOD THEREOF

(75) Inventor: Se hyun Kim, Icheon-si (KR)

(73) Assignee: Hynix Semiconductor Inc., Icheon (KR)

( * ) Notice: Subject to any disclaimer, the term of this patent is extended or adjusted under 35 U.S.C. 154(b) by 88 days.

(21) Appl. No.: 13/315,249

(22) Filed: Dec. 8, 2011

(65) Prior Publication Data

US 2012/0080746 A1 Apr. 5, 2012

Related U.S. Application Data

(62) Division of application No. 12/493,047, filed on Jun. 26, 2009, now Pat. No. 8,119,485.

(30) Foreign Application Priority Data

Feb. 10, 2009 (KR) .................. 10-2009-0010685

(51) Int. Cl.
*H01L 29/76* (2006.01)
*H01L 29/94* (2006.01)
*H01L 31/062* (2012.01)
*H01L 31/119* (2006.01)

(52) U.S. Cl.
USPC .................. 257/396; 257/647; 257/E21.047; 257/E21.147; 257/E21.148; 257/E21.149; 257/E21.229; 257/E21.243; 257/E21.304; 257/E21.546; 257/E21.645; 257/E21.646

(58) Field of Classification Search
USPC ......... 257/396, 395, 646, 647, 654, 774, 914, 257/E21.047, E21.147, E21.148, E21.149, 257/E21.229, E21.243, E21.304, E21.546, 257/E21.645, E21.646
See application file for complete search history.

(56) References Cited

U.S. PATENT DOCUMENTS

| 5,103,276 | A | * | 4/1992 | Shen et al. | ..................... 257/302 |
| 6,106,776 | A | * | 8/2000 | Borovetz et al. | ................ 422/44 |
| 8,119,485 | B2 | * | 2/2012 | Kim | .............................. 438/270 |

* cited by examiner

*Primary Examiner* — David Nhu

(57) ABSTRACT

Disclosed herein is a fabrication method of a semiconductor device to order to increase an operation liability of the semiconductor device. A method for fabricating a semiconductor device comprises forming a recess in a semiconductor substrate, forming a word line in a lower part of the recess, oxidizing a top portion of the word line, and depositing an insulating material in a remained part of the recess.

10 Claims, 9 Drawing Sheets

SEMICONDUCTOR DEVICE AND FABRICATION METHOD THEREOF

CROSS-REFERENCE TO RELATED APPLICATION

The present application is a divisional of U.S. patent application Ser. No. 12/493,047, filed Jun. 26, 2009 and now issued as U.S. Pat. No. 8,119,485. Priority to Korean patent application number 10-2009-0010685, filed on Feb. 10, 2009, which is incorporated by reference in its entirety, is claimed.

BACKGROUND OF THE INVENTION

The present invention relates to a method of manufacturing a high integration semiconductor memory device, and more specifically, to a method of forming a buried word line included in a cell array of a semiconductor memory device.

A type of semiconductor memory device (e.g., DRAM) includes a plurality of unit cells each including a capacitor and a transistor. A double capacitor has also been used to temporarily store data. A transistor has been used to transmit data (i.e., read and write) between a bit line and a capacitor corresponding to a control signal (word line). The transistor includes a gate, a source and a drain. Charges between the source and drain move in response to a control signal inputted to the gate. The charges move through a channel region in accordance with the properties and operation of the transistor.

When a transistor is formed in a semiconductor substrate, a gate is formed in the semiconductor substrate, and impurities are doped at both sides of the gate to form a source and a drain. Due to an increase in data capacity and integration of a semiconductor memory device, the size of each unit cell is driven to be smaller. That is, the design rule (i.e., critical dimension) of the capacitor and the transistor included in the unit cell is decreased. As a result, a channel length of the cell transistor is made shorter, which causes a short channel effect and a drain induced barrier lowering (DIBL) effect that hinders a normal operation. For preventing the short channel effect and the DIBL effect, the doping concentration of the channel region has been increased to obtain a threshold voltage required in the cell transistor. However, as the design rule is decreased to less than 100 nm, the increase of the doping concentration in the channel region increases an electric field of a storage node (SN) junction degrading a refresh characteristic of the semiconductor memory device. In order to prevent the degradation of the refresh characteristic, a cell transistor having a three-dimensional structure is used. As a result, it is possible to secure a long channel length of the cell transistor vertically even as the design rule is decreased. Moreover, if the channel length of the cell transistor is secured, the doping concentration is decreased to prevent the degradation of the refresh characteristic.

Further, as a semiconductor memory device is more highly integrated, a distance between a word line and a bit line which are connected to the cell transistor becomes narrower. Thus, a parasitic capacitance between the word line and the bit line increases, and an operation margin of a sense amplifier which senses and amplifies data transmitted through the bit line is deteriorated. Finally, an operation reliability of the semiconductor memory device is degraded.

For reducing the parasitic capacitance between the word line and the bit line, a buried word line structure has been suggested. The buried word line structure means that a word line is completely buried in a semiconductor substrate. A conductive material made of the word line is deposited in only lower part of a recess formed in the semiconductor substrate, and an insulating material is formed in an upper part of the recess. Accordingly, the word line is formed at a lower level than the bit line formed on top of the semiconductor substrate surface. Thus, the word line may be clearly separated from the bit line by the insulating material.

FIGS. 1a to 1g are cross-sectional diagrams illustrating a method for fabricating a semiconductor device that has a buried word line structure in a general semiconductor apparatus.

Referring to FIG. 1a, a device isolation film 104 that defines an active region is formed over a semiconductor substrate 102 by a shallow trench isolation (STI) method. After an insulating film 105 is formed over the active region and the device isolation film 104, a recess 106 is formed. The recess 106 is used for forming a gate pattern after forming the device isolation film 104. Two recesses 106 are formed over one active region, and one recess 106 is formed over the device isolation film 104.

As shown in FIG. 1b, a conductive material is deposited with a given thickness so that the recess 106 may be filled with a conductive layer 108. The conductive layer 108 may include a metal material such as TiN. Unlike a recess gate, in the buried word line structure, the inside of the recess 106 does not include polysilicon but a metal material such as TiN, thereby securing a gate threshold voltage margin because of the different physical properties related to charge movement between metal and silicon.

Referring to FIG. 1c, a chemical mechanical polishing (CMP) process is performed on the conductive layer 108 to expose the upper portion of the insulating film 105.

Referring to FIG. 1d, an etch-back process is performed using an etching selectivity difference between the insulating film 105 and the conductive layer 108 to remove the upper portion of the conductive layer 108 in the recess 106. After the etch-back process, the insulating film 105 is removed.

As shown in FIG. 1e, a nitride film 110 is deposited over the semiconductor substrate 102 and the upper portion of the recess 106 where the conductive layer 108 is removed. An interlayer insulating film 112 is deposited over the nitride film 110. A patterning process is then performed using a mask that defines a bit line contact to etch a portion of the nitride film 110 and the interlayer insulating film 112. A contact hole 114 for forming a bit line contact is formed between the neighboring recesses 106 formed in the active region, that is, over a drain region.

Referring to FIG. 1f, after a conductive material is buried in the contact hole 114, a planarization process is performed to form a bit line contact 116.

Referring to FIG. 1g, a metal barrier film 118 is formed over the bit line contact 116, and a bit line 120 is formed over the metal barrier film 118. The bit line 120, the metal barrier film 118 and the bit line contact 116 are surrounded by an insulating film 122 so that they may be electrically separated from a storage node contact 124 formed over a source region.

The semiconductor device fabricated by the above process increases a physical distance between the bit line 120 and the conductive layer 108 used as a word line buried in the recess 106, thereby reducing a parasitic capacitance between the word line and the bit line that may degrade the reliability of the semiconductor device. However, due to the characteristic of the etch-back process performed on the conductive layer 108 shown in FIG. 1d, the conductive layer 108 disposed over the upper portion of the recess 106 is not completely removed and remains at the sidewalls of the recess 106. The conductive layer 108 disposed in the center of the recess 106 is removed corresponding to the etching depth. When the conductive layer 108 remains at the sidewalls of the upper portion of the recess 106, an electrical field may be concentrated in the conductive layer 108 that remains at the sidewalls of the recess 106 when a voltage is applied to the word line. When the semiconductor device is used as a cell transistor, the electrical field degrades the operating characteristic of the unit cell, and a leakage current generated by the electrical field shortens a data storage time.

If the conductive layer 108 disposed at the sidewalls of the upper portion of the recess 106 is not completely removed, the conductive layer 108 may be exposed when the contact hole 114 for forming the bit line contact 116 is formed. In this case, the bit line contact 116 and the conductive layer 108 may be electrically connected. This phenomenon may occur while the storage node contact 124 as well as the bit line contact 116 is formed. The generation of the junction defect (i.e., electrically connecting the conductive layer 108 used as a word line with the bit line contact 116 or the storage node contact 124) degrades the operating reliability of the semiconductor device.

BRIEF SUMMARY OF THE INVENTION

Various embodiments of the present invention are directed to providing a method for fabricating a semiconductor device to insulate a word line and remove an electrical short between a contact and a word line by oxidizing a partial portion of the word line throughout an ion-implantation, to order to increase and enhance an operation liability of the semiconductor device.

According to an embodiment of the present invention, a method for fabricating a semiconductor device comprises: forming a recess in a semiconductor substrate; forming a word line in a lower part of the recess; oxidizing a top portion of the word line; and depositing an insulating material in a remained part of the recess.

Preferably, the method further comprises forming a device isolation layer defining an active region in the semiconductor substrate.

Preferably, the method further comprises forming a source/drain region in the active region at both sides of the recess; forming a contact connected to the source/drain region; and forming either a bit line or a capacitor on the contact.

Preferably, the oxidizing-a-top-portion-of-the-word-line includes an ion-implantation process for injecting oxide-ion in the recess at tilt.

Preferably, the ion-implantation process is rotatively performed with a tilt angle of about 35 degree and an energy of under 1 to 5 keV.

Preferably, the word line includes TiN and an oxidized top portion of the word line includes TiON.

Preferably, the oxidized top portion of the word line has a thickness of 50~100 Å.

Preferably, a depth of the recess is about 1100 Å to about 1300 Å and a height of the word line is about 800 Å to about 900 Å.

Preferably, the forming-a-word-line-in-a-lower-part-of-the-recess includes: depositing a conductive material in the recess; and performing an etch-back process for removing the conductive material with a predetermined depth to expose an upper part of the recess.

Preferably, the method further comprises performing a wet etch process to remove a partial portion of an oxidized top portion of the word line.

According to another embodiment of the present invention, a semiconductor device comprises: a buried word line including a top portion oxidized with a predetermined thickness in a recess of a semiconductor substrate; an insulating layer deposited on the buried word line in the recess; and a source/drain region located at both sides of the insulating layer in the semiconductor substrate.

Preferably, the semiconductor device further comprises a contact connected to the source/drain region; a bit line connected to the contact; and a capacitor connected to the contact.

Preferably, the word line includes TiN and an oxidized top portion of the word line includes TiON.

Preferably, an oxidized top portion of the word line has a thickness of 50~100 Å.

Preferably, a depth of the recess is about 1100 Å to about 1300 Å and a height of the word line is about 800 Å to about 900 Å.

Preferably, the semiconductor device further comprises a device-isolation layer defining an active region in the semiconductor substrate.

DESCRIPTION OF EMBODIMENTS

The present invention can be applied for fabricating a cell transistor of the semiconductor memory device, as well as forming any semiconductor device including a buried word line structure. Hereinafter, the present invention will be described in more detail with reference to the accompanying drawings.

FIGS. 2a to 2h are cross-sectional diagrams illustrating a method for fabricating a semiconductor device according to an embodiment of the present invention.

Figure 1A:
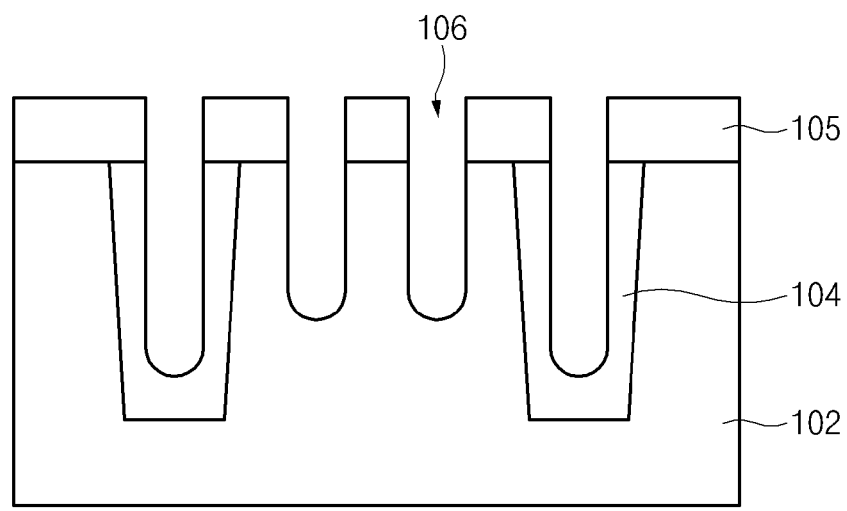
FIGS. 1a to 1g are cross-sectional diagrams illustrating a conventional method for fabricating a semiconductor device that has a buried word line structure in a general semiconductor apparatus.
Figure 1B:
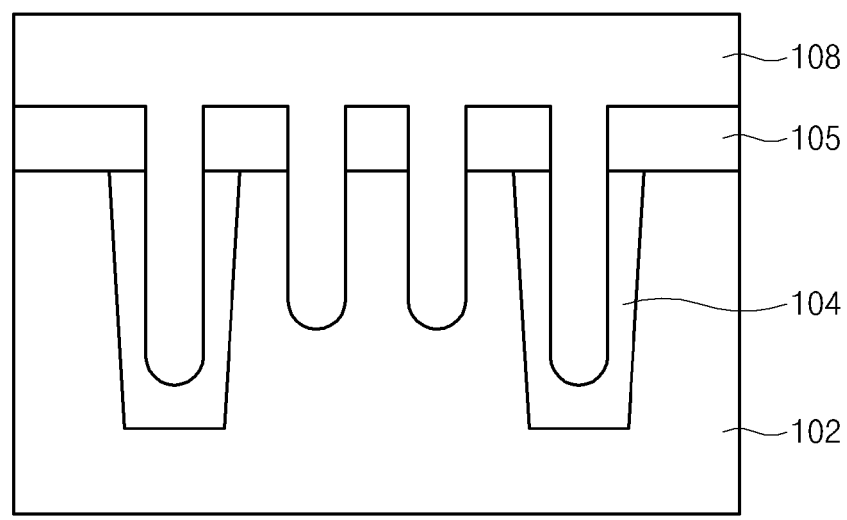
Figure 1C:
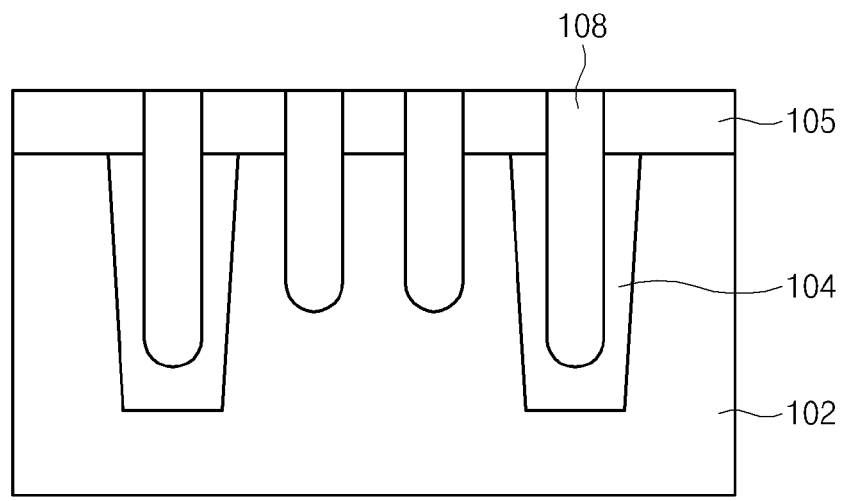
Figure 1D:
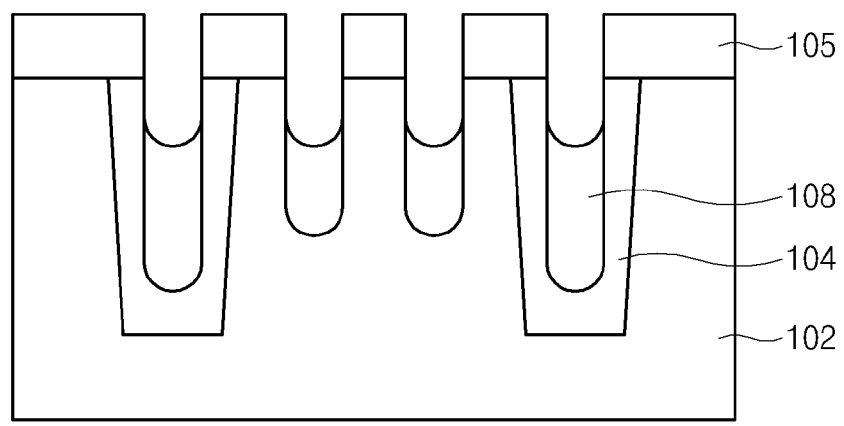
Figure 1E:
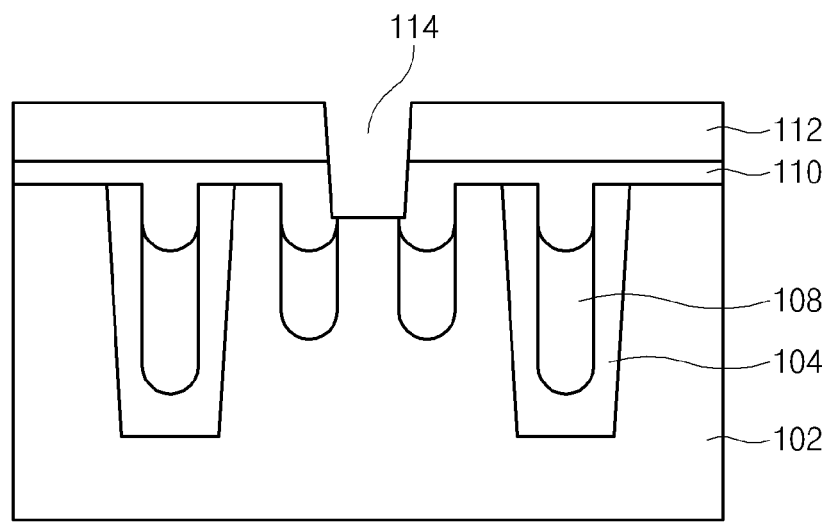
Figure 1F:
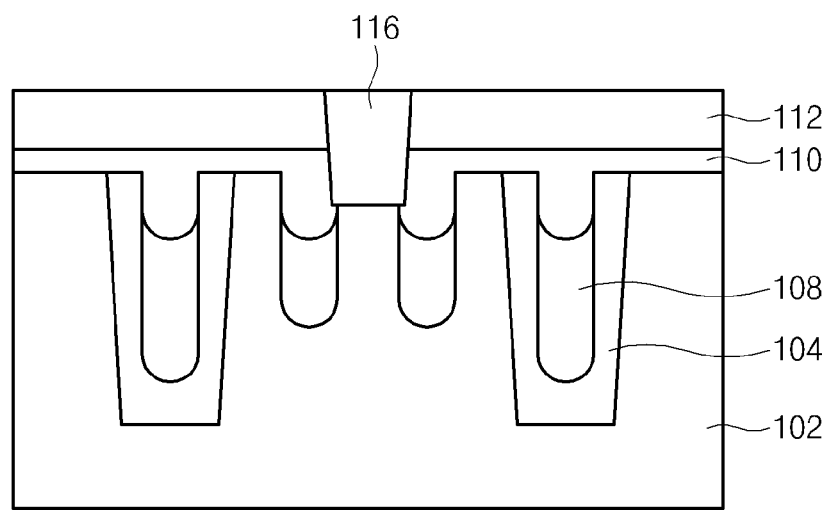
Figure 1G:
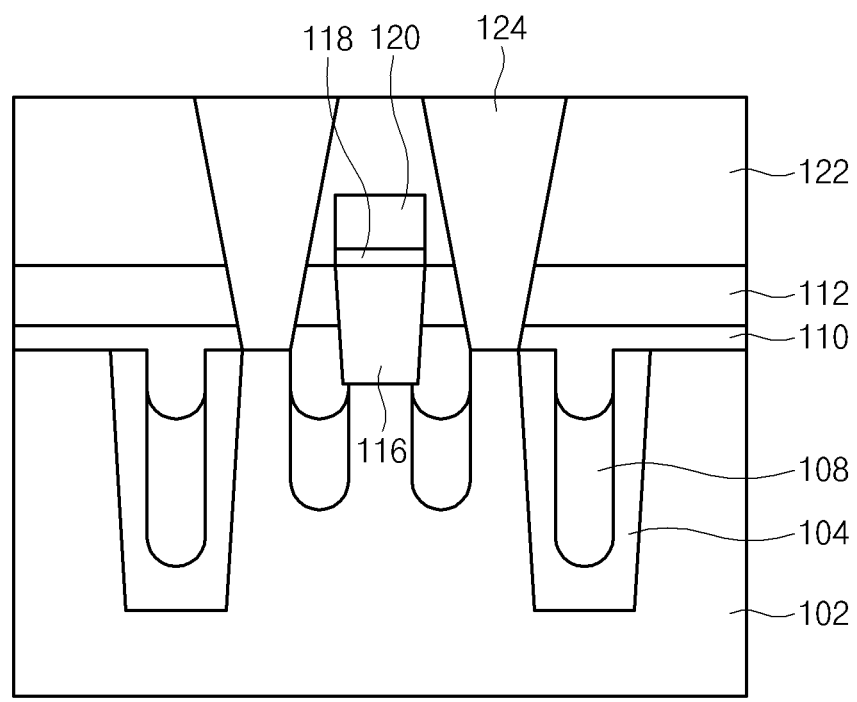
Figure 2A:
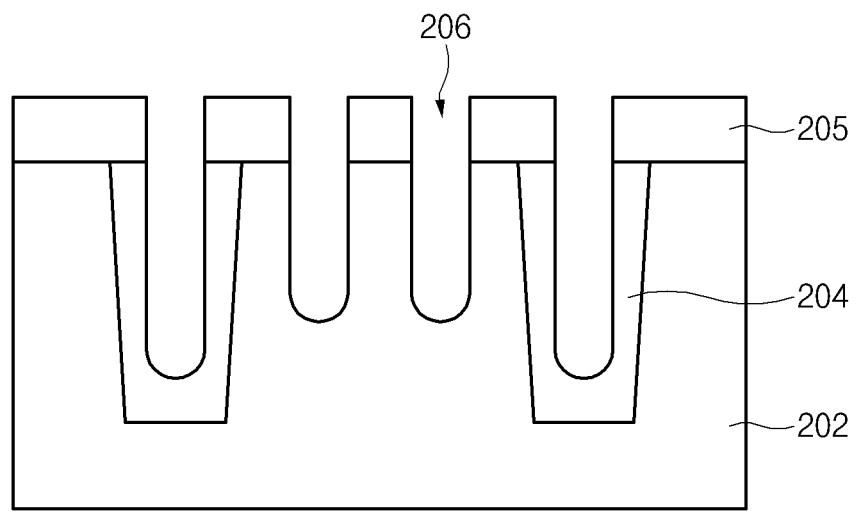
FIGS. 2a to 2h are cross-sectional diagrams illustrating a method for fabricating a semiconductor device according to an embodiment of the present invention.

Referring to FIG. 2a, a device isolation film 204 that defines an active region is formed over a semiconductor substrate 202 by a shallow trench isolation (STI) method. After an insulating film 205 is formed over the active region and the device isolation film 204, a recess 206 is formed. The recess 206 is for forming a gate pattern and formed after the device is isolation film 204. The depth of the recess 206 ranges from 1100 to 1300 Å. Two recesses 206 are formed over one active region, and one recess 206 is formed over the device isolation film 204.

Figure 2B:
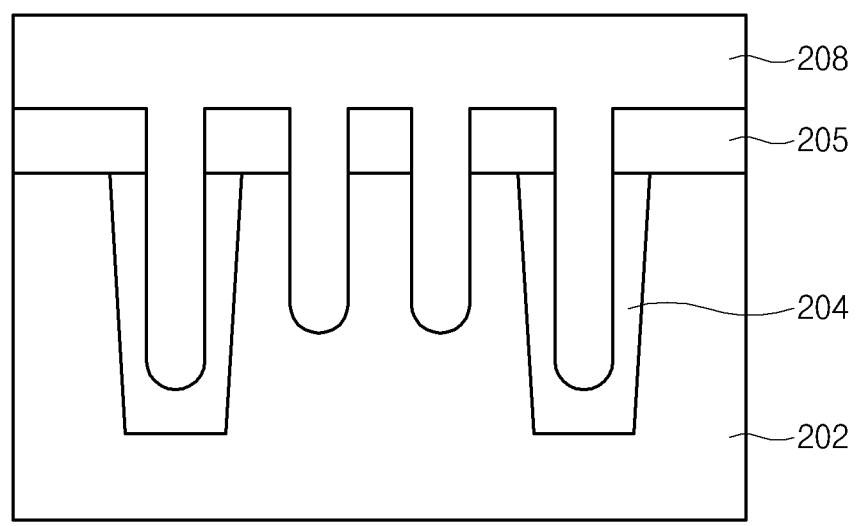

As shown in FIG. 2b, a conductive material is deposited with a given thickness so that the recess 206 may be filled with a conductive layer 208. The conductive layer 208 may include a metal material such as TiN. Unlike a recess gate, in the buried word line structure, the inside of the recess 206 does not include polysilicon but a metal material such as TiN, thereby securing a gate threshold voltage margin using the different physical properties related to charge movement between metal and silicon.

Figure 2C:
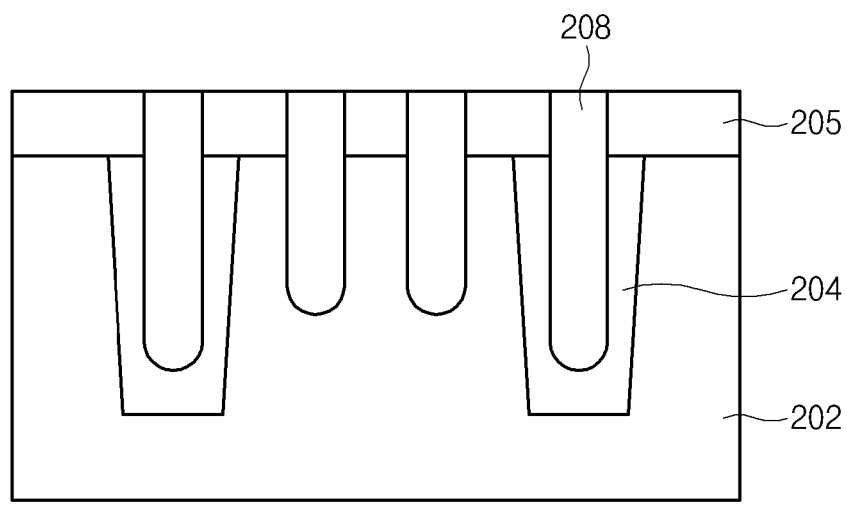

Referring to FIG. 2c, a chemical mechanical polishing (CMP) process is performed on the connective layer 208 to expose the upper portion of the insulating film 205.

Figure 2D:
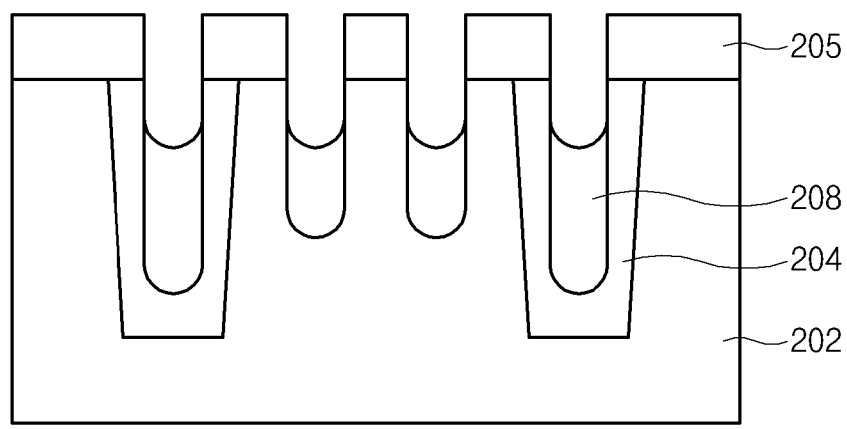

Referring to FIG. 2d, an etch-back process is performed to remove the upper portion of the conductive layer 208 filling in the recess 206. This is done by choosing an etchant with a different etching selectivity between the insulating film 205 and the conductive layer 208. When the upper portion of the conductive layer 208 is removed by the etch-back process, the conductive layer 208 disposed in the recess 206 is not completely planarized but removed with an etched depth only in the center of the recess 206. The conductive layer 208 may remain at the upper sidewalls of the recess 206.

Figure 2E:
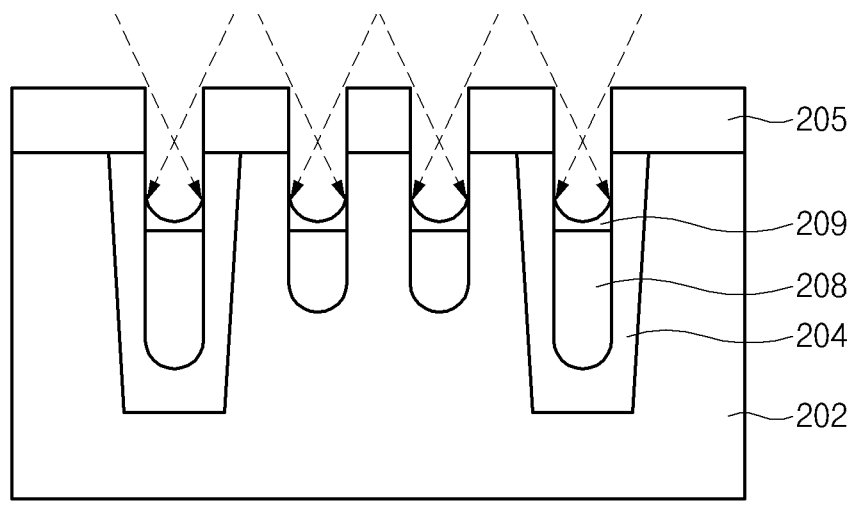

As shown in FIG. 2e, the upper portion of the conductive layer 208 is oxidized. In order to oxidize the upper portion of the conductive layer 208, the substrate 202 including the conductive layer 208 is rotated with a given tilt angle and implanted with oxide-ions to form an oxide film 209 on the conductive layer 208. For example, the oxide-ion-implantation process is performed with a tilt angle of about 35° and energy of under 1 to 5 keV, thereby obtaining an oxide film 209 that has a thickness ranging from 50 to 100 Å. In one embodiment, the tilt angle is no more than 45°. As mentioned above, the conductive layer 208 includes TiN, and the oxide film 209 includes TiON. After the oxidization process, the insulating film 205 that remains on the semiconductor substrate 202 is removed.

Although the conductive layer 208 remains at the upper sidewalls of the recess 206 after the etch-back process, the upper portion of the conductive layer 208 becomes oxidized and is changed into the oxide film 209. The oxide film 209 is an insulating material, thereby preventing the shortcomings of the conventional art. Particularly, it is possible to prevent the conductive layer 208 that remains at the sidewalls of the recess 206 from being electrically connected to a contact formed in a subsequent process between the neighboring conductive layers 208. It is also possible to inhibit the electric field from being concentrated on the sidewall of the conductive layer 208. When the ion-implantation process is performed to oxidize the upper portion of the conductive layer 208, the tilt angle and the implantation energy of the ion-implantation process are controlled so that it is possible to adjust the depth of the implant oxide-ions. As a result, it is possible to adjust the height of the conductive layer 108 more accurately using the ion-implantation process than to adjust it by a conventional etch-back process. For example, when the height of the conductive layer 208 can be adjusted accurately in the present invention, it is possible to form the conductive layer 208 with a height ranging from 800 to 900 Å in the recess that has a depth ranging from 1100 to 1300 Å.

When a portion of the conductive layer 208 formed over the recess 206 is etched, the amount etched by an etch-back process is reduced and the amount of the oxide-ion-implantation is increased so as to adjust the height of the conductive layer 208. In this case, since the etch-back process reduces the etched amount, the thickness of the insulating film 205 that protects the rest of the region in the etch-back process is not required to be deposited thickly.

Figure 2F:
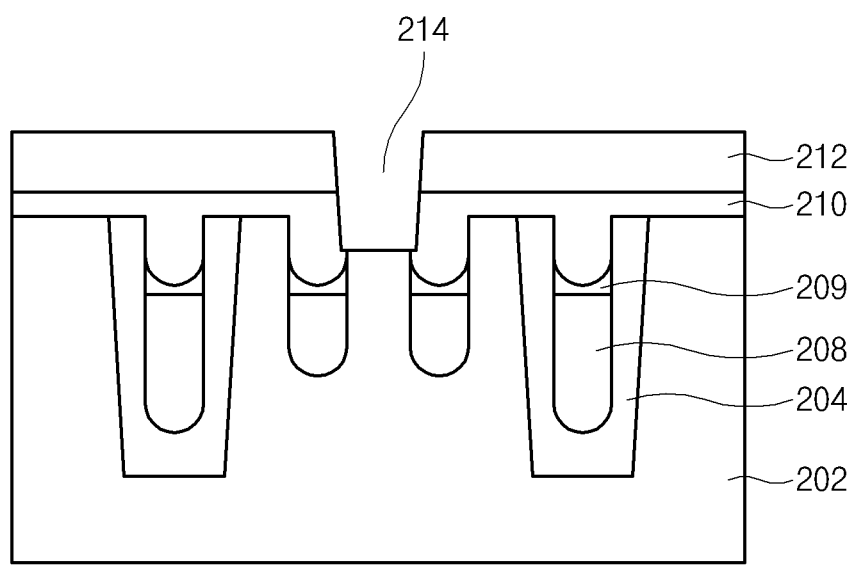

As shown in FIG. 2f, a nitride film 210 is deposited over the upper portion of the oxide film 209 and the semiconductor substrate 202. A first interlayer insulating film 212 is deposited over the nitride film 210. A patterning process is performed using a mask that defines a bit line contact to etch a portion of the nitride film 210 and the first interlayer insulating film 212. As a result, a contact hole 214 for forming a bit line contact is formed between the neighboring recesses 206 formed in the active region, that is, over a drain region.

Figure 2G:
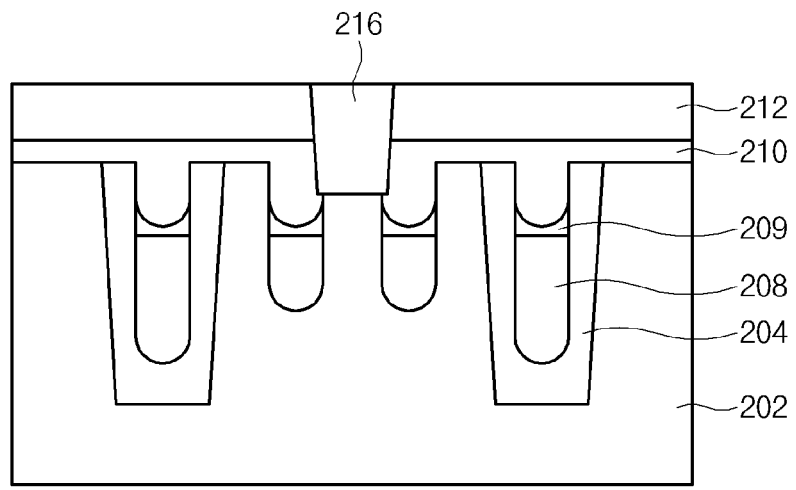

Referring to FIG. 2g, a conductive material is filled in the contact hole 214, and a planarization process is performed to form a bit line contact 216.

Figure 2H:
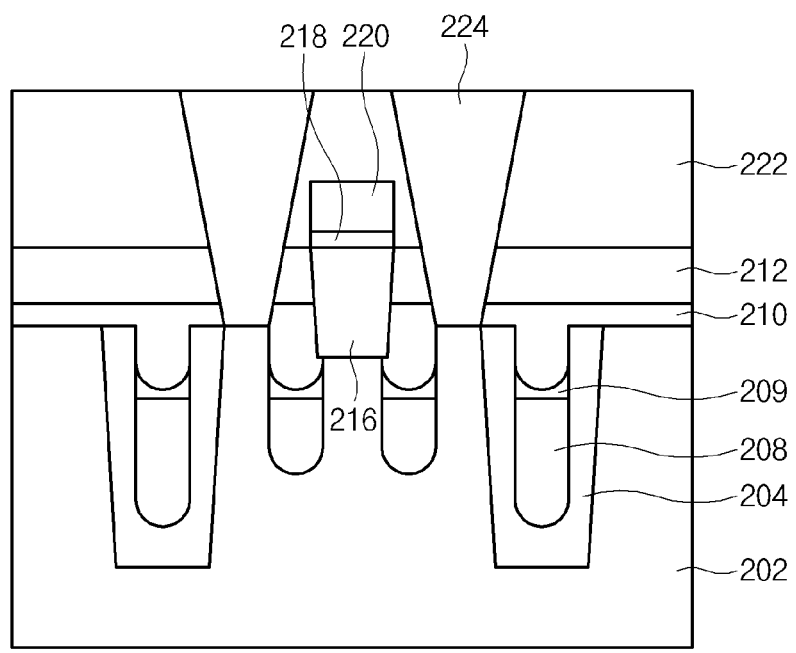

Referring to FIG. 2h, a metal barrier film 218 is formed over the bit line contact 216, and a bit line 220 is formed over the metal barrier film 218. A second interlayer insulating film 222 is deposited over the first interlayer insulating film 212 including a metal barrier film 218 and a bit line 220. The insulating material is deposited over the bit line 220 for electric insulation. The first interlayer insulating film 212 and the second interlayer insulating film 222 are etched using a mask that defines the location of the storage node contact 224 to expose the active region. A conductive material is filled therein to obtain a storage node 224. The bit line 220, the metal barrier film 218 and the bit line contact 216 are surrounded by the first insulating film 212 and the second insulating film 222 so that the storage node contact 224 formed over a source region is electrically separated. A capacitor (not shown) is further formed over the storage node contact 224 so that a unit cell of a semiconductor memory apparatus may be obtained.

Figure 3:
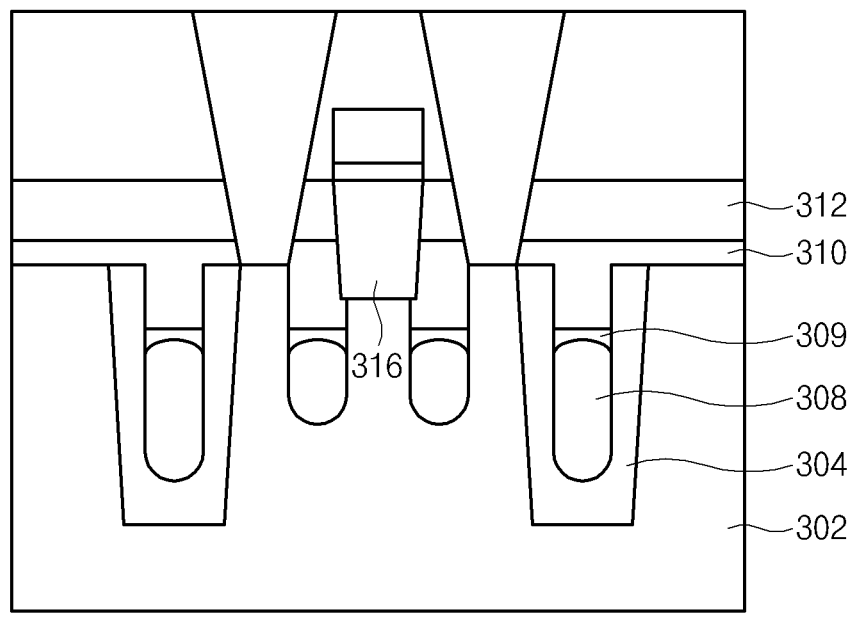
FIG. 3 is a cross-sectional diagram illustrating a method for fabricating a semiconductor device according to another embodiment of the present invention.

FIG. 3 is a cross-sectional diagram illustrating a method for fabricating a semiconductor device according to another embodiment of the present invention.

A semiconductor device fabricated by another embodiment of the present invention is different from that shown in FIG. 2h. A wet etching process is further performed after the oxidation process. If the oxidation process such as a tilted oxide-ion-implantation is performed for a longer time, an oxide film 309 becomes thicker. Particularly, the oxide film 309 formed at a side portion of a conductive layer 308 is thicker than those at a center portion of the conductive layer 308. Thus, an upper portion of the conductive layer 308 has a convex shape. The wet etching process uses an etching selectivity difference between the conductive layer 308 and an oxide film 309 after the upper portion of the conductive layer 308 is oxidized as shown in FIG. 2e. That is, when the conductive layer 308 includes TiN and the oxide film 309 includes TiON, the wet etching process is performed using an etching selectivity difference between TiN and TiON to remove the oxide film 309 that remains at the sidewalls of the upper portion of the recess. As a result, while the upper portion of the oxide film 209 shown in FIG. 2h has a concave shape, the upper portion of the oxide film 309 shown in FIG. 3 can be flat.

Except for the wet etching process, the same procedure for forming a device isolation film 304 and the conductive layer 308 in a semiconductor substrate 302; depositing a nitride film 310 and a first interlayer insulating film 312 to form a bit line contact 316; and forming a bit line and a storage node contact is repeated in this embodiment of the present invention.

As mentioned above, the semiconductor device of the present invention comprises a word line buried in a semiconductor substrate that has an upper portion oxidized with a given thickness, an insulating film buried over the word line in the semiconductor substrate, and a source/drain region. When a unit cell of a semiconductor memory apparatus is formed, the semiconductor device comprises a storage node contact and a bit line contact connected to a source/drain region, a bit line formed over the bit line contact, and a capacitor formed over the storage node contact.

A method for fabricating a semiconductor device according to the present invention comprises: forming a recess in a semiconductor substrate; forming a word line in a lower part of the recess; oxidizing a top portion of the word line; and forming an insulating material over the upper portion of the recess. The method may further comprise removing a part of the upper portion of the word line which is oxidized by a wet etching process using an etching selectivity difference between the word line and the oxidized upper portion of the word line. The method can reduce a leakage current as well as a junction defect which may be generated by a conductive material (i.e., a residual metal) that may remain at the sidewalls of the recess while forming a buried word line structure.

The semiconductor device that has a buried word line structure is fabricated so that a conductive material does not remain at sidewalls of the upper portion of the recess buried with a word line. As a result, the semiconductor device prevents an electric junction defect between the word line and the bit line contact or the storage node contact, and improves uniformity of the word line formed in the recess to improve operating characteristics of the semiconductor device. When the semiconductor device is used as a cell transistor, it improves the device reliability in its refresh characteristic.

In the present invention, since the ion-implantation process transforms the upper portion of the word line (gate) into an oxide film, the amount of dry etching for removing the word line disposed over the recess can be reduced in comparison with the conventional art. As a result, it is unnecessary to thickly deposit a hard mask film used as an etching barrier film in the etching process. Furthermore, it is possible to reduce a void generated by a defect when a conductive material for forming a word line is buried.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device, comprising:
   a buried word line provided in a recess of a semiconductor substrate;
   an oxide film formed within the recess and on the buried word line;
   an insulating layer provided over the oxide film in the recess; and
   first and second doped regions located at both sides, respectively, of the recess,
   wherein the oxide film is obtained by oxidizing an upper portion of the buried word line through an ion-implantation.

2. The semiconductor device according to claim 1, wherein the buried word line includes TiN and the oxide film includes TiON.

3. The semiconductor device according to claim 2, wherein the oxide film has a thickness of no more than 100 Å.

4. The semiconductor device according to claim 1, wherein a depth of the recess is about 1100 Å to about 1300 Å and a height of the buried word line is about 800 Å to about 900 Å.

5. The semiconductor device according to claim 1, further comprising a device-isolation layer defining an active region in the semiconductor substrate.

6. The semiconductor device according to claim 1, wherein the insulating layer comprises nitride.

7. The semiconductor device according to claim 1, the semiconductor device further comprises:
   a bit line contact formed between the recess and a second recess neighboring the recess.

8. The semiconductor device according to claim 1, wherein an upper portion of the oxide film has a concave shape.

9. The semiconductor device according to claim 1, wherein an upper portion of the oxide film has a flat shape.

10. The semiconductor device according to claim 1, the semiconductor device further comprises:
    a storage node contact formed over the semiconductor substrate and coupled to the first doped regions or the second doped region.

* * * * *